(12) United States Patent
Nakamura

(10) Patent No.: US 6,411,498 B2
(45) Date of Patent: Jun. 25, 2002

(54) SINTERED FUSE AND SOLID ELECTROLYTIC CAPACITOR UTILIZING THE SAME

(75) Inventor: Shinji Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/734,541

(22) Filed: Dec. 13, 2000

(30) Foreign Application Priority Data

Dec. 14, 1999 (JP) .......................................... 11-354820

(51) Int. Cl.[7] .................................................. H01G 9/00
(52) U.S. Cl. ........................................ 361/523; 337/222
(58) Field of Search ................................ 361/523, 528, 361/529, 532, 534, 510, 508, 516, 275.4; 29/25.03; 337/222, 290, 159

(56) References Cited

U.S. PATENT DOCUMENTS

| | | | | |
|---|---|---|---|---|
| 4,107,762 A | * | 8/1978 | Shirn et al. | |
| 4,121,277 A | * | 10/1978 | Hilbert | 361/534 |
| 4,581,681 A | * | 4/1986 | Feilhauer | 361/534 |
| 4,763,228 A | * | 8/1988 | Su | 361/534 |
| 4,814,946 A | * | 3/1989 | Su | 361/523 |
| 4,989,119 A | * | 1/1991 | Gouvernelle | 361/534 |
| 5,478,965 A | * | 12/1995 | Hashiba | 29/25.03 |
| 5,629,830 A | * | 5/1997 | Yamagami et al. | 361/535 |
| 5,661,628 A | * | 8/1997 | Yamagami | 361/275.4 |

* cited by examiner

*Primary Examiner*—Anthony Dinkins
(74) *Attorney, Agent, or Firm*—Arent Fox Kintner Plotkin & Kahn, PLLC

(57) ABSTRACT

A sintered fuse is structured by forming a sintered body of metal powders into a wire form or a plate form. As for the metal powders, powders of the grain diameter of approximately a few $\mu$m, such as Cu or Al, can be used and different types of metal powders can be mixed. In addition, by interposing this sintered fuse (4) between, for example, the negative electrode (12) and the second external lead (3), a solid electrolytic capacitor is formed. As a result, a fuse which melts at the same level of temperature as in a prior art can be obtained without utilizing toxic Pb and a solid electrolytic capacitor, which has this fuse built into it and which is safe and highly reliable, can be obtained.

10 Claims, 1 Drawing Sheet

SINTERED FUSE AND SOLID ELECTROLYTIC CAPACITOR UTILIZING THE SAME

FIELD OF THE INVENTION

The present invention relates to a sintered fuse which is built in, for example, in a solid electrolytic capacitor, in particular, to a sintered fuse which can fuse at a temperature higher than, for example, the soldering temperature and lower than the thermal withstanding temperature of an element to be protected, such as a solid electrolytic capacitor, as well as to a solid electrolytic capacitor which utilizes the fuse.

BACKGROUND OF THE INVENTION

A conventional solid electrolytic capacitor is formed by electrically connecting, respectively, the positive electrode and the negative electrode of a capacitor element, which is a sintered body of a valve action metal powder, such as a tantalum powder, to the external leads and by covering the periphery with a package made of a resin. And, by interposing, on the negative electrode side, for example, a fuse between the negative electrode of the capacitor element and the external lead, a structure is obtained wherein harmful effects to other parts of the circuit can be prevented even in the case that the capacitor element arises in temperature due to an irregularity of the circuit, or the like, and the temperature of the capacitor element increases excessively so as to be in a short circuited condition.

In the case of a tantalum electrolytic capacitor, for example, the capacitor element made of a sintered body of tantalum powder burns out at approximately 600° C. Therefore, it is necessary to cut off the circuit at a temperature lower than that. On the other hand, this type of solid electrolytic capacitor is mounted on a circuit substrate through a solder reflow or a solder flow. The temperature for this mounting operation is approximately 230° C. to 260° C. and therefore the fuse needs to withstand a temperature higher than that. From such a point of view, conventionally, an Sn—Pb alloy (Ag is slightly included in the ratio of Sn:Pb=1:9) is used as a material of the fuse so as to fuse at approximately 300° C.

As described above, an alloy including Pb is generally used as a material for a fuse which fuses at approximately 300° C. Pb is a heavy metal, however, and the trend today is to ban the utilization of Pb from the point of view of environmental pollution prevention. There is no material which has the same melting point level without the utilization of this Pb and the development of a substitute which fuses at a temperature of approximately 300° C. has become an urgent problem to be solved.

SUMMARY OF THE INVENTION

The present invention is provided considering such circumstances and the purpose thereof is to provide a fuse which fuses at approximately same level of temperature as that in a prior art without utilizing toxic Pb.

Another purpose of the present invention is to provide a solid electrolytic capacitor utilizing a built in fuse which does not utilize Pb and which fuses effectively.

The present inventor has researched diligently, as described above, in order to obtain a material which fuses at a low temperature, of approximately 300° C., without utilizing Pb, and which can substitute for a conventional fuse, and, as a result, it was found that the fine metal powders sintered was melted at a temperature of approximately ⅓ or less of the original melting point of the metal. For example, when powders of 1 to 3 μm of tantalum were sintered in a vacuum, and when heat was applied, the material change was examined by a thermo-scale, and it was found to melt at approximately 600 to 800° C., in spite of the original melting point of tantalum of approximately 3000° C., and it was found to be able to be utilized as a fuse material even in the case that Pb, of which the melting point is appropriately low, is not utilized.

A sintered fuse according to the present invention comprises: a sintered body of metal powders in a wire form or a plate form.

By having this structure, a material which fuses at approximately 300° C. can be obtained by, for example, sintering copper powders. And by forming a wire form of the diameter of approximately 0.1 mm, the substitute is obtained which can be utilized for a fuse, of which the main component is Pb, according to a prior art. Here, due to the conditions at the time of sintering, close contact conditions between powder grains change and the melting temperature is also changed. For example, when the sintering condition is set at high temperature, the adhesion between powders becomes stronger, and exhibits properties that are closer to the original nature of the simple metal so that the melting temperature becomes higher. In addition, in the case that the sintering temperature is low, the sintering will not proceed sufficiently, the meting temperature becomes lower and, in addition, contact resistance value between fine powder grains increases so that heating effect by an excessive current is generated to easily melt.

A solid electrolytic capacitor according to the present invention comprises a capacitor element which has a positive electrode lead and a negative electrode which is formed on the outer periphery surface, first and second external leads to which the above positive electrode lead and negative electrode are electrically connected, respectively, a fuse which is interposed, in either one of the electrical connections, between the above positive electrode lead and the first external lead or between the above negative electrode and the second external lead and a package which covers around the above capacitor element, wherein the above fuse is constructed of a sintered fuse formed of a sintered body of metal powders.

DETAILED DESCRIPTION

Figure 1:
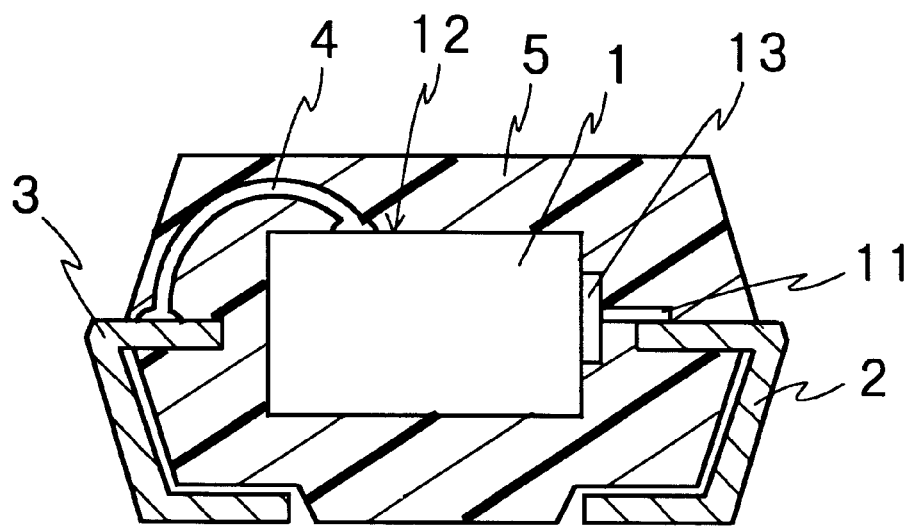
FIG. 1 is a cross section exemplary view showing an example of a solid electrolytic capacitor utilizing a sintered fuse according to the present invention.

Next, a sintered fuse according to the present invention and a solid electrolytic capacitor utilizing the same are described. The sintered fuse according to the present invention is formed of a sintered body of metal powder in a wire form or a plate form.

As described above, the present inventor researched diligently in order to obtain a material which fuses at the conventional melting point of approximately 260° C. to 350° C. without the utilization of Pb and, as a result, it was found that the metal powders sintered had the melting temperature which is lowered to approximately ⅓ or less of the original melting point of metal bulk so as to fuse and be cut at a low temperature. In addition, it is found that this fusing temperature changes slightly due to the sintering temperature of the sintered body, the sintering time, or the like, so that the fusing temperature can be, to a certain extent, adjusted according to the sintering condition.

As for metal powders it is preferable for the main parts to include the grains of which the diameter is, approximately, a few μm, that is to say, 1 to 10 μm and it is more preferable for the grain diameter to be 1 to 5 μm in order to lower the melting (fusing) temperature. Here, as for the main parts, it is acceptable that powders other than the powders of which the grain diameter is approximately 1 to 10 μm can be mixed in a small amount. That is to say, in the case that the crystal size becomes smaller the active condition is obtained so as to fuse at a lower temperature since the surface energy becomes larger. However, in the case that the grain diameter becomes excessively small, wherein the powder grains mutually contact too closely to be not able to increase the surface area, it doesn't contribute to the lowering of the fusing temperature. Therefore, by sintering powders, of which the grain diameter is approximately a few μm, to an extent of a light contact so as to increase the surface area, the effect of lowering the fusing temperature is obtained. Though the fusing temperature changes slightly depending on this sintered condition, it is lowered in comparison with the melting point of the metal itself and, therefore, a sintered body of metal powders, of which the melting point is high, melts at high temperature and a sintered body of metal powders, of which the melting point is low, melts at low temperature, and the sintered body melts approximately, ⅓ of that, respectively. That is to say, metal powders can be selected for a desired fusing temperature.

For example, the melting point of Cu is 1083° C., the melting point of Ag is 962° C. and the melting point of Au is 1064° C. and, therefore, by utilizing powders of these a fuse which fuses at approximately 300° C. can be constructed. In addition, though the melting point of Al is 660° C., by making the grain diameter of the powder large or by strengthening the sintered condition, the sintered body can be melted at a temperature between the melting temperature which tends to be lowered though fine powders and the melting point of a bulk and, thereby, a fuse which fuses at approximately 300° C. can also be formed.

As for the formation of a sintered wire, forming a cylindrical bulk by sintering metal powders and by pulling this through dies it is made to be in a fine wire form. This is heat processed again so as to fuse at a predetermined temperature. This condition of heat processing depending on the metal used and, in general, an ordinary sintered body can be obtained by carrying out the sintering at a temperature of approximately ½ to ⅓ of the melting point of the metal. By changing this condition, the fusing temperature of the sintered body can be changed to a certain extent. To obtain a plate form instead of a wire, by sintering after forming a plate form (by filling in, with powder, the inside of a concave part of a thin box mold) a plate form sintered fuse can be obtained in the same way. Instead, a sintered body in a bulk form is manufactured and the sintered body may be formed into a wire form or a plate form through mechanical processing. The thickness of the wire, the thickness and the size of the plate form, or the like, can be selected so as to obtain a desired fusing characteristic in accordance with the purpose.

According to the present invention, the property of metal, in a powder form, that the fusing temperature is lower than that of metal in bulk form is utilized to construct a fuse by a sintered body and, therefore, a fuse which fuses at a desired temperature can be constructed without utilizing Pb, which harms the environment. As a result, a fuse can be obtained by sintering metal powders, which is environmentally friendly and melted at a comparatively low temperature.

Though, in the above described example, a sintered fuse of metal powders is obtained by considering only the melting point of the bulk metal from the point of view of a fuse which fuses due to the temperature, it is necessary to form a fuse which is inserted directly in a current path so as to fuse due to overheating due to the excessive current. In this case, it is necessary to increase the temperature by the fuse itself and it is necessary to be a material which generates Joule heat. That is to say, it is necessary to utilize the material of which the specific resistance is large to a certain degree. From that point of view the above described Cu has a specific resistance of 1.7 ($10^{-8}$ Ω•m, though below this unit is omitted this same unit is considered to be attached to the numerals), Ag has 1.6, Au has 2.2, all of which are considerably small in comparison with the 12 of Sn and the 21 of Pb. Therefore, in the case that fusion by current is intended it is necessary to consider this specific resistance.

In this case, by making the fuse of a sintered body, gap between powders exists so that the cross section area of the current flowing part becomes smaller for the same thickness of fuse so as to increase the resistance as a fuse. However, the porosity ratio of the sintered body is 30% to 50% at most, which only has the effect of increasing specific resistance approximately two times and it is preferable to mix in metal powder of large specific resistance in order to further increase the specific resistance. For example, the specific resistance of Zr is 44 and, though this material itself has a high melting point and cannot directly melt down, it conveys heat to the neighboring Cu powders, or the like, which is the major part of the fuse so as to melt down and can make the sintered body function as a fuse.

The sintering condition can, of course, be controlled to adjust the resistivity through the polarity ratio. Here, the melting point and the specific resistance of metals which can be utilized are listed in Table 1. From this Table 1 metal powder, of which the melting point and the specific resistance are appropriate, can be selected or can be used for the mixture.

TABLE 1

| Melting Point and Specific Resistance of Metal Elements | | |
|---|---|---|
| Metal element | melting point (° C.) | specific resistance ($\times 10^{-8}$ Ω · m) |
| Al | 660 | 2.7 |
| Ag | 962 | 1.6 |
| Au | 1064 | 2.2 |
| Cu | 1083 | 1.7 |
| Zn | 420 | 6.0 |
| Sn | 231 | 12.0 |
| Ni | 1455 | 7.0 |
| Co | 1494 | 6.4 |
| Mg | 651 | 4.3 |
| Tl | 302 | 17.0 |
| Zr | 1852 | 44.0 |
| Pb (reference) | 327 | 21.0 |

Next, a tantalum electrolytic capacitor, which has a wire of about 0.1 mmø in diameter made of Cu powders of which the above described grain diameter is approximately a few μm and is sintered so that the polarity ratio becomes approximately 40%, is described.

As shown in a cross section exemplary view of a solid electrolytic capacitor utilizing this sintered fuse of FIG. 1, a capacitor element 1 is formed so as to have a positive electrode which is formed by burying one end part of the positive lead 11 in a sintered body of valve action metal from one wall face of the sintered body and a negative electrode 12 which is formed on the side walls of the sintered body. Then, the positive lead 11 is welded to the first external lead 2 which is in a plate form while the negative electrode 12 is electrically connected to the second external lead 3 in a plate form via the above described sintered fuse 4. The capacitor element 1 and the connection parts of the above described first and second external leads 2 and 3 are covered with a package 5.

The capacitor element 1 has the same structure as a conventional capacitor element, which is formed into a rectangular or cubic form or a cylindrical form of valve action metal powder such as tantalum, aluminum or niobium and a positive electrode lead 11 is buried in one wall face when it is sintered so that an oxidized film, such as $Ta_2O_5$, is formed on the periphery of the powder grain through positive electrode oxidization while a manganese dioxide layer, a graphite layer, a silver layer, or the like, is formed on the outer periphery of the sintered body to form the negative electrode 12. The size of the sintered body differs depending on the types of fuse and, for example, it is formed into the dimensions of a cube of from about 0.3 mm to about a few mm. In addition, the external leads 2 and 3 are formed of a lead frame, which has been punched out of a plate material such as 42 alloy, Ni or Cu.

In order to manufacture this solid electrolytic capacitor, for example, tantalum powders are formed into the above described structure and a tantalum wire of about 0.2 mmø in diameter, for example, buried in one of the wall faces of the structure, which is sintered in a vacuum so as to form a sintered body, in one of which wall faces the positive electrode lead 11 is buried. Then, the base part of the positive electrode lead is covered with a Teflon ring 13 while the edge part of the positive lead 11 of this capacitor element is welded to a stainless steel bar which is formed of, for example, a stainless steel plate, in the number of several tens.

Next, all the capacitor elements welded to the stainless steel bar are submerged in, for example, a phosphorous acid solution so that the positive electrode lead 11 is oxidized as a positive electrode and, thereby, oxide film made of $Ta_2O_5$ is formed on the periphery of the tantalum powder (chemical conversion treatment). After that, they are submerged in manganese nitrate solution to form a manganese dioxide layer (not shown) inside of the sintered body and the outer periphery surface thereof and repetitive re-chemical conversion treatment which repeats, several times, the formation process of the above described oxide film is carried out. In addition, a graphite layer (not shown) is formed on the outer surface (outer periphery of the sintered body) and, in addition, a silver layer (not shown) is formed on the outer surface and, thereby, a capacitor element 1, of which the surface is made to be a negative electrode 12, is formed.

The positive electrode lead 11 of this capacitor element 1 is welded with resistance heating to the first external lead 2, which is formed in a lead frame and the negative electrode 12 is electrically connected to the second external lead 3 of the lead frame via the above described fuse 4 formed of a sintered body by means of thermal pressure. At this time, when the fuse is bonded, it is preferable to pay attention to the amount of time for thermal pressure application, the pressure, or the like, from the point of view of preventing the cut off at the time of the bonding. In addition, this sintered fuse 4 is formed through the settings, such as the material and sintering conditions, or the like, so that the fusing temperature thereof is lower than the burn out temperature (approximately 600° C.) of the capacitor element 1 and is higher than the soldering temperature (approximately 230° C. to 260° C.) at the time of mounting and, more preferably, is in a range of 260° C. to 400° C.

The lead frame to which this capacitor element 1 is welded is set within mold dies. Then, by filling in the cavity of the mold dies with a resin for molding, the capacitor element 1 and the connection parts of the external leads 2 and 3 are covered with the resin for molding so as to form a package 5. Each lead is cut off to be separated from the lead frame and is formed and, thereby, a solid electrolytic capacitor as shown in FIG. 1 is obtained.

Figure 2:
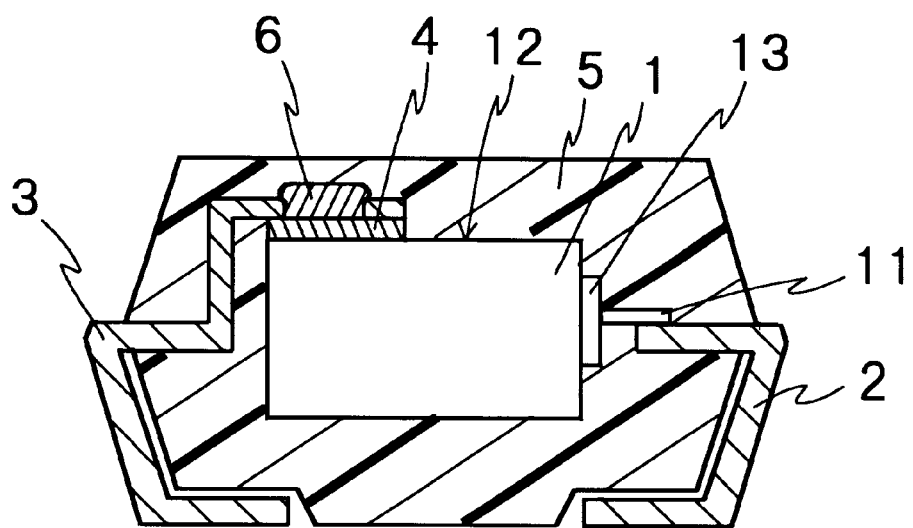
FIG. 2 is a cross section exemplary view showing another example of a solid electrolytic capacitor utilizing a sintered fuse according to the present invention.

Though the above described example is an example wherein a sintered fuse in a wire form is connected between the negative electrode 12 of the capacitor element 1 and the second external lead, a fuse 4 in a plate form may be interposed between the negative electrode 12 of the capacitor element 1 and the second external lead 3 as shown in FIG. 2 so as to provide a hole through the second external lead part located on the fuse 4 and to provide an arc erasure agent 6, such as silica ($SiO_2$) of high purity. By providing such as structure, when the fuse in a plate form fuses due to the temperature increase of the capacitor element 1, a gap part is formed between the external lead 3 and the outer periphery of the capacitor element 1 by through the absorption by the arc erasure agent 6 so that the gap between them is electrically separated. In the case of the utilization of a fuse in such a plate form, it operates as a fuse which fuses through the temperature in same way.

Furthermore, though in each of the above described examples, the fuse is inserted between the negative electrode of the capacitor element and the second external lead, in the same way there is a case where it is inserted between the positive electrode lead and the first external lead.

According to the present invention a fuse which functions equally as a conventional fuse formed of an alloy of Pb and Sn can be obtained from a sintered body of metal powder without utilizing toxic Pb so as to contribute greatly to the improvement of the environment. In addition, according to the present invention, by selecting the metal material and the sintering conditions, the fusing temperature can be controlled so as to easily obtain a fuse in accordance with the purpose.

Furthermore, according to a solid electrolytic capacitor of the present invention, negative effect to other parts within a circuit due to a short circuit based on the burn out of a capacitor element can be eliminated by the fuse, of which the fusing temperature is lower than the burn out temperature of the capacitor element and is higher than the soldering temperature for mounting the solid electrolytic capacitor, while having a fuse built in that does not utilize Pb.

Although preferred example have been described in some detail it is to be understood that certain changes can be made by those skilled in the art without departing from the spirit and scope of the invention as defined by the appended claims.

What is claimed is:

1. A sintered fuse comprising:
   a sintered body of metal powders, said sintered body being formed in a wire form or in a plate form.

2. The sintered fuse of claim 1 wherein said metal powders are made of at least one type of metals selected from a group consisting of Cu, Ag, Au and Al.

3. The sintered fuse of claim 2 wherein said metal powders further include a metal other than said metals.

4. The sintered fuse of claim 1 wherein said metal powders have mainly powders, each of which has a diameter of 1 to 10 μm.

5. A solid electrolytic capacitor comprising:

a capacitor element having a positive electrode lead and a negative electrode formed on the outer periphery surface;

first and second external leads electrically connected to said positive electrode lead and negative electrode, respectively;

a fuse interposed into either electric connection between said positive electrode lead and said first external lead or between said negative electrode and said second external lead; and a package covering the periphery of said capacitor element, wherein said fuse is a sintered fuse formed of a sintered body of metal powders.

6. The capacitor of claim 5 wherein said sintered body is a body in a wire form or in a plate form, which is made of at least one type of metals selected from a group consisting of Cu, Ag, Au and Al.

7. The capacitor of claim 6 wherein another metal powder is further mixed in said sintered body.

8. The capacitor of claim 7 wherein said another metal powder is made of a material having a larger specific resistance than that of said at least one type of metals.

9. The capacitor of claim 5 wherein said fuse is formed so that the melting temperature is lower than 600° C. and is higher than 230° C.

10. The capacitor of claim 9 wherein said melting temperature is adjusted by a sintering temperature of said metal powders.

* * * * *